(12) United States Patent
Kaneda

(10) Patent No.: US 11,131,913 B2
(45) Date of Patent: Sep. 28, 2021

(54) LIGHT SOURCE DEVICE, ILLUMINATION APPARATUS, AND PROJECTOR

(71) Applicant: SONY CORPORATION, Tokyo (JP)

(72) Inventor: Kazumasa Kaneda, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/768,204

(22) PCT Filed: Nov. 22, 2018

(86) PCT No.: PCT/JP2018/043129
§ 371 (c)(1),
(2) Date: May 29, 2020

(87) PCT Pub. No.: WO2019/111722
PCT Pub. Date: Jun. 13, 2019

(65) Prior Publication Data
US 2020/0292929 A1 Sep. 17, 2020

(30) Foreign Application Priority Data

Dec. 5, 2017 (JP) .............................. JP2017-233186

(51) Int. Cl.
*G03B 21/20* (2006.01)
*F21V 5/04* (2006.01)
(Continued)

(52) U.S. Cl.
CPC ............ *G03B 21/2013* (2013.01); *F21V 5/04* (2013.01); *F21V 7/0066* (2013.01); *H04N 9/31* (2013.01)

(58) Field of Classification Search
CPC .. G03B 21/28; G03B 21/208; G03B 21/2013; G03B 21/2033; G03B 21/2053;
(Continued)

(56) References Cited

U.S. PATENT DOCUMENTS

2013/0021581 A1\* 1/2013 Takahashi ........... H01S 5/02255
353/31
2013/0301013 A1 11/2013 Samejima et al.
(Continued)

FOREIGN PATENT DOCUMENTS

| JP | 2013-233635 | 11/2013 |
| JP | 2016-115447 | 6/2016 |

(Continued)

OTHER PUBLICATIONS

International Search Report prepared by the Japan Patent Office dated Dec. 14, 2018, for International Application No. PCT/JP2018/043129.

*Primary Examiner* — Sultan Chowdhury
(74) *Attorney, Agent, or Firm* — Sheridan Ross P.C.

(57) ABSTRACT

A light source device of the present disclosure includes a plurality of light source sections, each light source section having at least one light source and the light source sections emitting light beams of mutually different colors, at least one light source substrate mounted with at least one light source section among the plurality of light source sections, and an optical-path combining optical system that combines optical paths of light beams emitted from the respective light source sections, in which the at least one light source section mounted on the light source substrate includes a plurality of the light sources that emits light beams of an identical color.

19 Claims, 12 Drawing Sheets

(51) Int. Cl.
*F21V 7/00* (2006.01)
*H04N 9/31* (2006.01)

(58) Field of Classification Search
CPC .. G03B 21/2046; G03B 21/2066; H04N 9/31; H04N 9/315; H04N 9/3102; H04N 9/3152; H04N 9/3155; H04N 9/3164; F21V 7/04; F21V 7/0066
See application file for complete search history.

(56) References Cited

U.S. PATENT DOCUMENTS

| | | | |
|---|---|---|---|
| 2015/0109585 A1* | 4/2015 | Masuda | G02B 27/104 353/31 |
| 2015/0309399 A1* | 10/2015 | Kim | F21K 9/64 353/33 |
| 2016/0195236 A1 | 7/2016 | Kita | |
| 2016/0198135 A1* | 7/2016 | Kita | G02B 27/48 348/756 |
| 2017/0227180 A1 | 8/2017 | Anderson et al. | |
| 2017/0332056 A1* | 11/2017 | Ando | H04N 9/3111 |
| 2017/0336703 A1* | 11/2017 | Takagi | H01L 33/62 |
| 2018/0195693 A1* | 7/2018 | Yanagisawa | F21V 5/004 |

FOREIGN PATENT DOCUMENTS

| | | |
|---|---|---|
| JP | 2017-168547 | 9/2017 |
| WO | WO 2015/056380 | 4/2015 |

* cited by examiner (A)

(B)

LIGHT SOURCE DEVICE, ILLUMINATION APPARATUS, AND PROJECTOR

CROSS REFERENCE TO RELATED APPLICATIONS

This application is a national stage application under 35 U.S.C. 371 and claims the benefit of PCT Application No. PCT/JP2018/043129 having an international filing date of 11 Nov. 2018, which designated the United States, which PCT application claimed the benefit of Japanese Patent Application No. 2017-233186 filed 5 Dec. 2017, the entire disclosures of each of which are incorporated herein by reference.

TECHNICAL FIELD

The present disclosure relates to a light source device and an illumination apparatus that generate illumination light, and a projector that projects an image on the basis of the illumination light.

BACKGROUND ART

A light source device used in a projector and the like may use a plurality of light sources for increasing in luminance (see PTLs 1 to 4).

CITATION LIST

Patent Literature

PTL 1: Japanese Unexamined Patent Application Publication 2011-107371
PTL 2: Japanese Unexamined Patent Application Publication No. 2014-132301
PTL 3: Japanese Unexamined Patent Application Publication No. 2017-116674
PTL 4: International Publication No. WO 2010/064559

SUMMARY OF THE INVENTION

In a case of using a plurality of light sources, it is desired to combine optical paths from respective light sources. However, for example, when using a CAN laser as a laser light source and combining the optical paths by a mirror, the size of an entire arrangement is increased. In a case of increasing the number of light sources for further increasing luminance of the projector, there may be restriction on an arrangement of the light sources and a heat dissipation issue, and it may be difficult to increase the number.

It is desirable to provide a light source device, an illumination apparatus, and a projector that are compact in size make it possible to increase luminance.

A light source device according to an embodiment of the present disclosure includes a plurality of light source sections, each light source section having at least one light source and the light source sections emitting light bearers of mutually different colors, at least one light source substrate mounted with at least one light source section among the plurality of light source sections, and an optical-path combining optical system that combines optical paths of light beams emitted from the respective light source sections, in which the at least one light source section mounted on the light source substrate includes a plurality of the light sources that emits light beams of an identical color.

An illumination apparatus according to an embodiment of the present disclosure includes a light source device, and an illumination optical system that generates illumination light on the basis of light from the light source device, in which the light source device includes a plurality of light source sections, each light source section having at least one light source and the light source sections emitting light beams of mutually different colors, at least one light source substrate mounted with at least one light source section among the plurality of light source sections, and an optical-path combining optical system that combines optical paths of light beams emitted from the respective light source sections, and the at least one light source section mounted on the light source substrate includes a plurality of the light sources that emits light beams of an identical color.

A projector according to an embodiment of the present disclosure includes an illumination apparatus, a light modulation element that modulates illumination light from the illumination apparatus and generates a projection image, and a projection optical system that projects the projection image generated by the light modulation element on a projection surface, in which the illumination apparatus includes a plurality of light source sections, each light source section having at least one light source and the light source sections emitting light beams of mutually different colors, at least one light source substrate mounted with at least one light source section among the plurality of light source sections, and an optical-path combining optical system that combines optical paths of light beams emitted from the respective light source sections, and the at least one light source section mounted on the light source substrate includes a plurality of the light sources that emits light beams of an identical color.

In the light source device, the illumination apparatus, or the projector according to an embodiment of the present disclosure, the plurality of light source sections each having the light source is mounted on a single light source substrate. Optical paths of light beams emitted from the respective light source sections are combined by the optical-path combining optical system.

MODES FOR CARRYING OUT THE INVENTION

In the following, modes for carrying out the present disclosure are described in detail with reference to the drawings. It is to be noted that the description is given in the following order.
1. First Embodiment (FIG. 1 to FIG. 13)
   1.1 Configuration Example of Projector
   1.2 Configuration Example of Light Source Device
      1.2.0 Basic Configuration Example of Light Source Device
      1.2.1 First Configuration Example of Light Source Device
      1.2.2 Second Configuration Example of Light Source Device
      1.2.3 Third Configuration Example of Light Source Device
   1.3 Relation between Eccentricity and Incident Angle on Illumination Optical System
   1.4 Effects
2. Second Embodiment (FIG. 14 to FIG. 17)
   2.1 First Configuration Example of Light Source Device
   2.2 Second Configuration Example of Light Source Device
3. Third Embodiment (FIG. 18 to FIG. 19)
4. Other Embodiments

1. First Embodiment

[1.1 Configuration Example of Projector]

First, description is given of an outline of a projector to which a light source device and an illumination apparatus according to an embodiment of the present disclosure is applied. However, the applications of the light source device and the illumination apparatus according to an embodiment of the present disclosure are not limited to the projector, and the light source device and the illumination apparatus according to an embodiment of the present disclosure may also be used for other applications.

Figure 1:
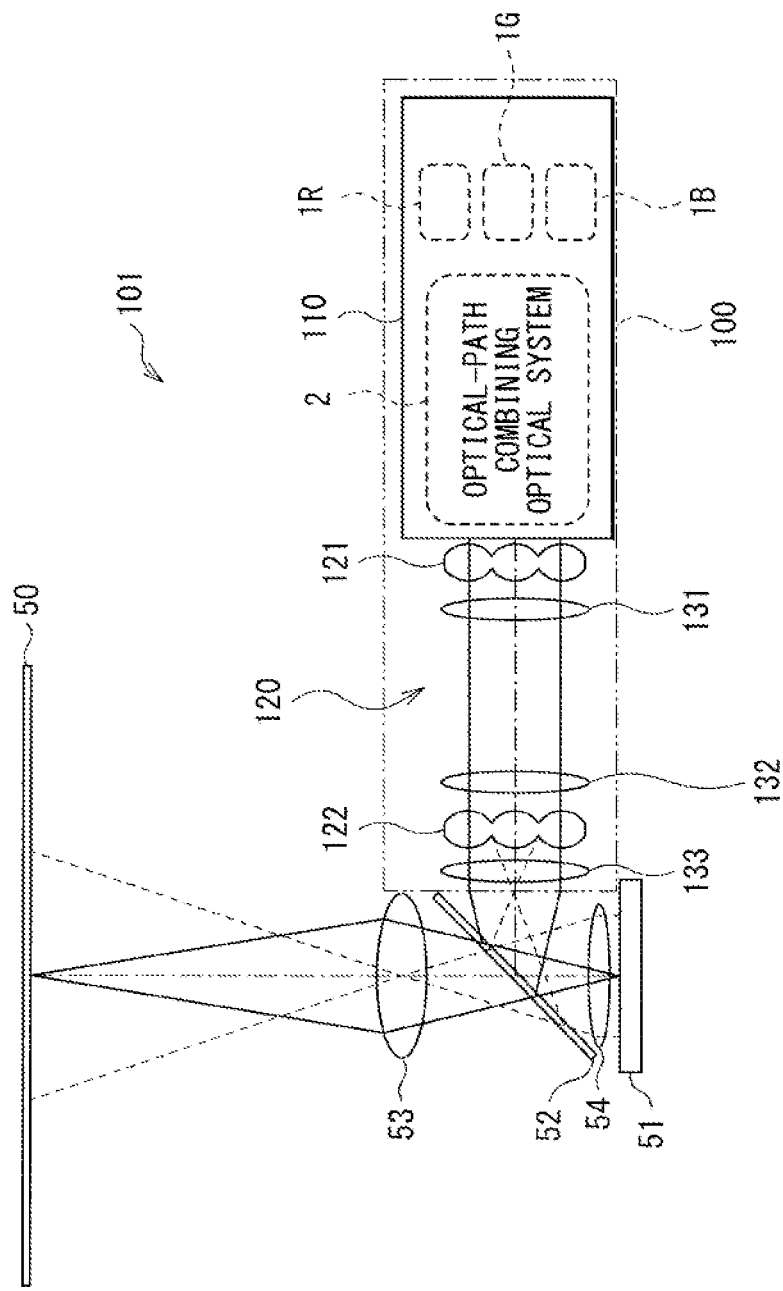
FIG. 1 is a configuration diagram illustrating an outline of an optical system of a projector according to a first embodiment of the present disclosure.

FIG. 1 illustrates an outline of an optical system of a projector 101 according to a first embodiment of the present disclosure.

The projector 101 includes an illumination apparatus 100 and a light modulation element 51 that modulates illumination light from the illumination apparatus 100 and generates a projection image.

The projector 101 further includes a polarization separation element 52, a projection lens 53, and a field lens 54.

The field lens 54 is disposed between the light modulation element 51 and the polarization separation element 52.

The polarization separation element 52 is, for example, a polarization beam splitter, which selectively reflects light of specific polarization (for example, S polarization) among illumination light from the illumination apparatus 100 and selectively transmits light of other polarization (for example, P polarization). In this manner, the illumination light (for example, S polarization) from the illumination apparatus 100 is selectively reflected and enters the light modulation element 51 via the field lens 54. Moreover, image light (for example, P polarization) outputted from the light modulation element 51 selectively passes through the polarization separation element 52 via the field lens 54 and enters the projection lens 53.

The light modulation element 51 is an image display element that emits image light by modulating the illumination light from the illumination apparatus 100 on the basis of an image signal and reflecting the illumination light. The light modulation element 51 includes a reflective liquid crystal cell such as an LCOS (Liquid Crystal On Silicon).

The projection lens 53 is a projection optical system that includes a plurality of lenses, for example, and projects the projection image (image light) generated by the light modulation element 51 on a projection surface of a screen 50 or the like.

The illumination apparatus 100 generates and emits illumination light beams of respective colors of R (red), G (green), and B (blue). The illumination apparatus 100 includes a light source device 110 that emits light beams of the respective colors of R, G, and B in a time division manner and an illumination optical system 120 that generates and emits illumination light on the basis of the light beams from the light source device 110.

The illumination optical system 120 equalizes the light beams of the respective colors from the light source device 110 and emits the resulting light as illumination light. The illumination optical system 120 includes a pair of fly-eye lens arrays 121 and 122, sub-condenser lenses 131 and 132 disposed on an optical path between the pair of fly-eye lens arrays 121 and 122, and a condenser lens 133 disposed on an optical path between the fly-eye lens array 122 and the polarization separation element 52.

The light source device 110 includes a plurality of light source sections that emits light beams of mutually different colors and an optical-path combining optical system 2 that combines optical paths of light beams emitted from the respective light source sections.

The plurality of light source sections includes a red light source section 1R that emits red light, a green light source section 1G that emits green light, and a blue light source section 1B that emits blue light.

Each of the plurality of light source sections includes at least one light source. The optical-path combining optical system 2 combines, as described later, optical paths of light beans of an identical color emitted from each light source of each light source section. Moreover, the optical-path combining optical system 2 combines, as described later, optical paths of light beams of mutually different colors emitted from each light source.

[1.2 Configuration Example of Light Source Device]
(1.2.0 Basic Configuration Example of Light Source Device)

Figure 2:
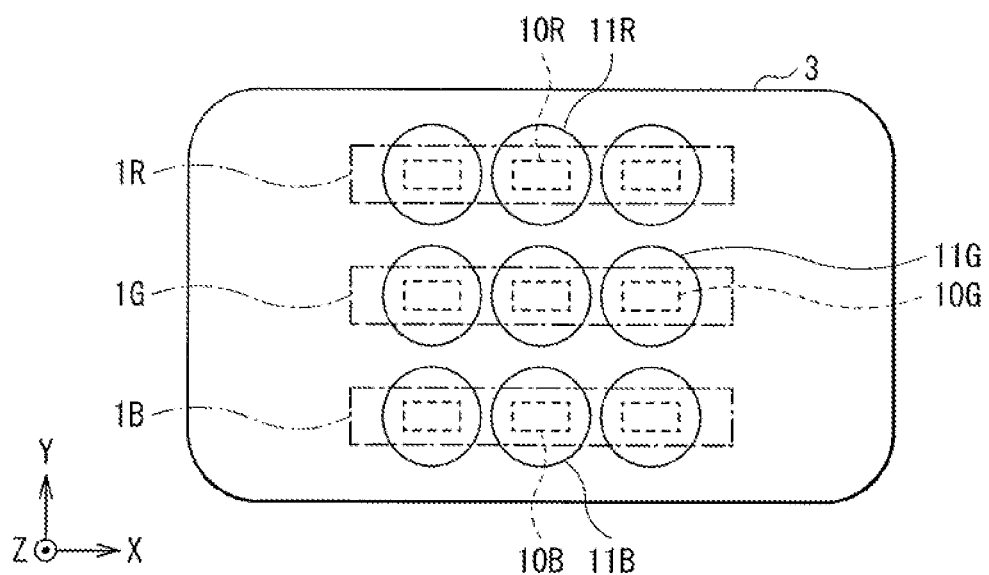
FIG. 2 is a plan view illustrating a basic configuration example of a light source device according to the first embodiment.
Figure 3:
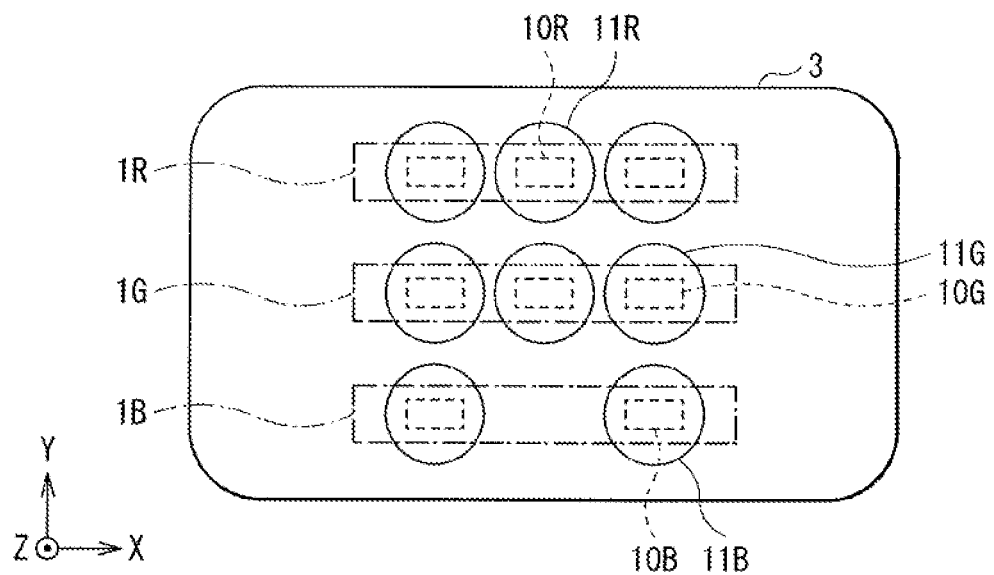
FIG. 3 is a plan view illustrating a modification example of the light source device according to the first embodiment.

FIG. 2 illustrates a basic configuration example of the light source device 110. FIG. 3 illustrates a modification example of the light source device 110.

The light source device 110 includes a single light source substrate 3 and the red light source section 1R, the green light source section 1G, and the blue light source section 1B mounted on the single light source substrate 3. Moreover, the light source device 110 includes a plurality of red collimator lenses 11R, a plurality of green collimator lenses 11G, and a plurality of blue collimator lenses 11B.

The light source substrate 3 is preferably a substrate including a material with high heat dissipation, such as a substrate including copper. A back surface of the light source substrate 3 is preferably flat-shaped allowing for heat dissipation.

The red light source section 1R includes a plurality of red light sources 10R. The red collimator lenses 11R are disposed respectively correspondingly to the plurality of red light sources 10R. The red collimator lenses 11R are individually disposed for the respective red light sources 10R. The plurality of red light sources 10R is disposed in a line in an identical direction (for example, X direction).

The green light source section 1G includes a plurality of green light sources 10G. The green collimator lenses 11G are disposed respectively correspondingly to the plurality of green light sources 10G. The green collimator lenses 11G are individually disposed for the respective green light sources 10G. The plurality of green light sources 106 is disposed in a line in an identical direction (for example, X direction).

The blue light source section 1B includes a plurality of blue light sources 10B. The blue collimator lenses 11B are disposed respectively correspondingly to the plurality of blue light sources 10B. The blue collimator lenses 11B are individually disposed for the respective blue light sources 10B. The plurality of blue light sources 10B is disposed in a line in an identical direction (for example, X direction).

It is to be noted that, FIG. 2 illustrates the configuration example in which the same numbers of red light sources 10R, green light sources 10G, and blue light sources 10B are disposed; however, as illustrated in the modification example of FIG. 3, the numbers of light sources of the respective colors may be different. The modification example of FIG. 3 is the configuration example in which the number includes less blue light sources 10B is smaller than the numbers of red light sources 10R and green light sources 10G.

It is to be noted that the number of light sources of each color is not limited to three or two as illustrated in FIG. 2 or FIG. 3. For example, there may be four or more light sources of each color. Moreover, the number of the light sources of each color may be two.

Each of the red light source 10R, the green light source 10G, and the blue light source 10B includes, for example, a laser light source (LD: Laser Diode). Each of the red light source 10R, the green light source 10G, and the blue light source 10B is preferably a laser having a chip structure (laser chip) for miniaturization. Each of the red light source 10R, the green light source 10G, and the blue light source 10B may be a laser chip having one light emitting point or a laser chip having a plurality of light emitting points. Each of the red light source 10R, the green light source 10G, and the blue light source 10B preferably includes a laser chip directly mounted on the light source substrate 3 with high heat dissipation for the purpose of heat dissipation.

Next, configuration examples of the light source device 110 are described along with a specific example of the optical-path combining optical system 2.

(1.2.1 First Configuration Example of Light Source Device)

Figure 4:
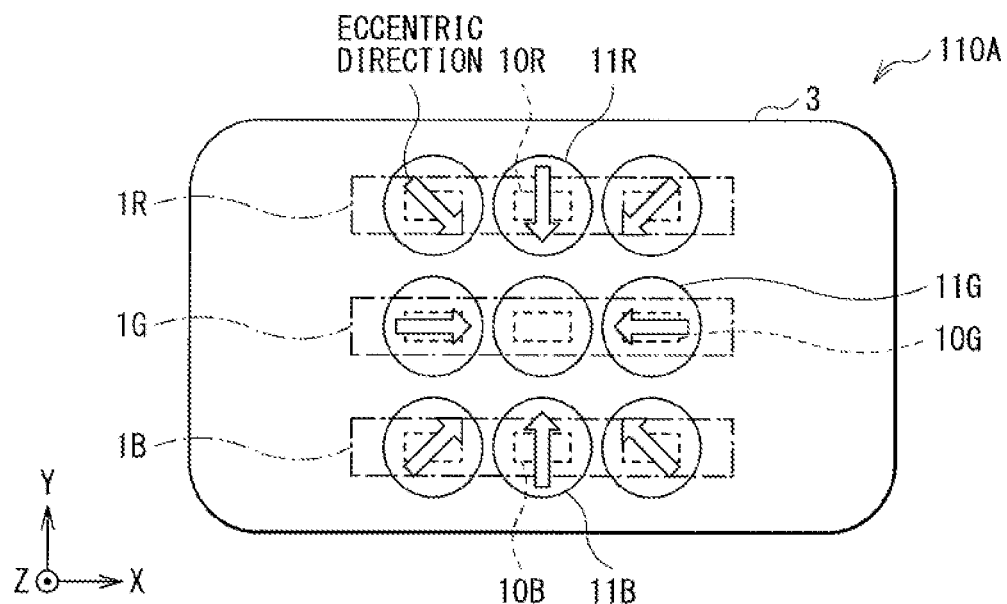
FIG. 4 is a plan view illustrating a first configuration example of the light source device according to the first embodiment.
Figure 5:
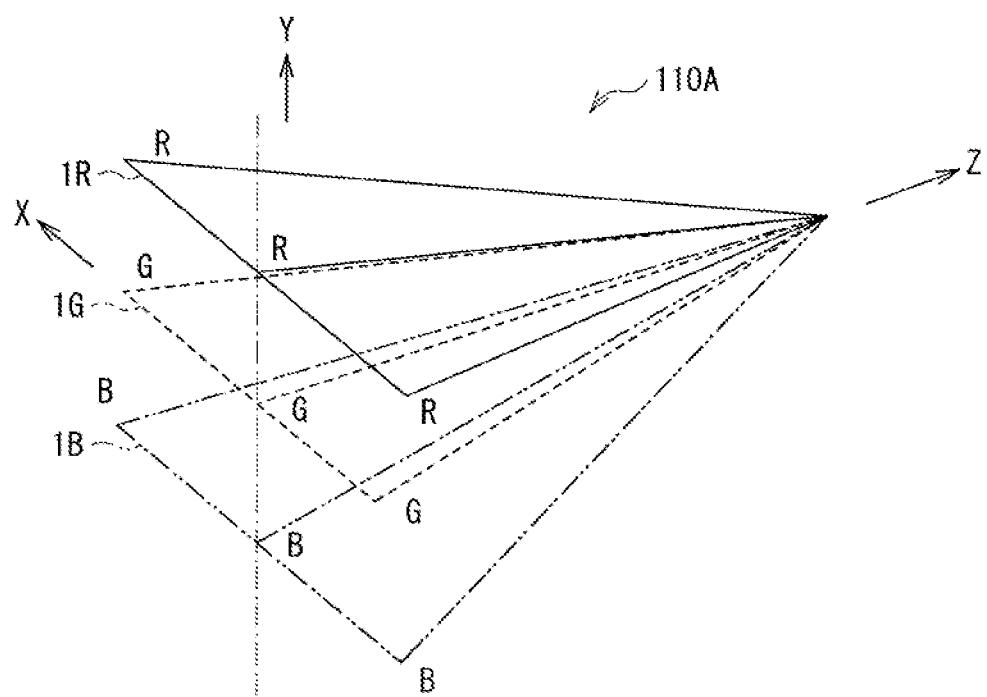
FIG. 5 is an explanatory drawing schematically illustrating how optical paths are combined by the light source device illustrated in FIG. 4.

FIG. 4 illustrates a first configuration example of the light source device 110 according to the first embodiment. FIG. 5 schematically illustrates how optical paths are combined by a light source device 110A illustrated in FIG. 4.

In the light source device 110A illustrated in FIG. 4, each of the red collimator lens 11R, the green collimator lens 11G, and the blue collimator lens 11B corresponds to a specific example of a "first optical-path combining optical member" and a "lens member" according to the present disclosure.

In the light source device 110A, each of the plurality of red collimator lenses 11R is disposed to be eccentric to an optical axis of the corresponding red light source 10R. Each of the plurality of green collimator lenses 11G is disposed to be eccentric to an optical axis of the corresponding green light source 10G, except the green collimator lens 11G located in the center. Each of the plurality of blue collimator lenses 11B is disposed to be eccentric to an optical axis of the corresponding blue light source 10B. Causing each collimator lens to be eccentric makes it possible to combine optical paths of light beams from the light sources toward an identical position.

The eccentric direction and the eccentricity of each collimator lens are adjusted to be the direction and the eccentricity that make it possible to combine optical paths of the light beams of an identical color and also to combine the optical paths of the light beams of different colors. For example, the eccentric direction is a direction of a center position when seeing planarly the plurality of red collimator lenses 11R, the plurality of green collimator lenses 11G, and the plurality of blue collimator lenses 11B as a whole. In this manner, the optical paths of the light beams from the respective light sources are combined toward the identical position.

(1.2.2 Second Configuration Example of Light Source Device)

Figure 6:
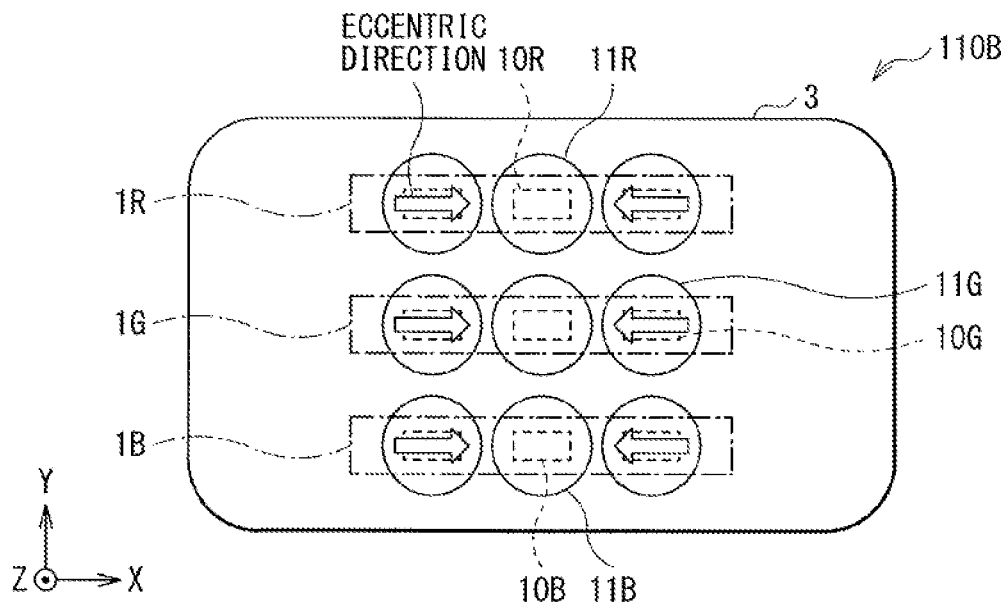
FIG. 6 is a plan view of a second configuration example of the light source device according to the first embodiment.
Figure 7:
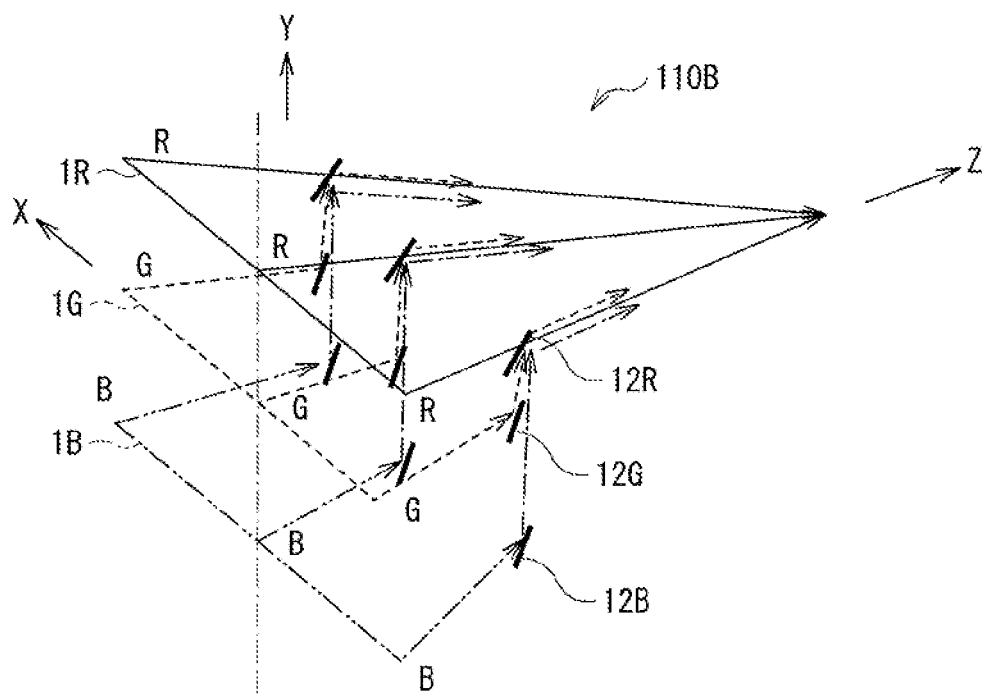
FIG. 7 is an explanatory drawing schematically illustrating how the optical paths are combined by the light source device illustrated in FIG. 6.

FIG. 6 illustrates a second configuration example of the light source device 110 according to the first embodiment. FIG. 7 schematically illustrates how optical paths are combined by a light source device 110B illustrated in FIG. 6.

The light source device 110B illustrated in FIG. 6 and FIG. 7 further includes a dichroic mirror 12R, a dichroic mirror 12G, and a total reflection mirror 12B in addition to the configuration of the light source device 110.

In the light source device 110B illustrated in FIG. 6 and FIG. 7, each of the red collimator lens 11R, the green collimator lens 11G, and the blue collimator lens 11B corresponds to a specific example of the "first optical-path combining optical member" and the "lens member" according to the present disclosure. Furthermore, each of the dichroic mirror 12R, the dichroic mirror 12G, and the total reflection mirror 12B corresponds to a specific example of a "second optical-path combining optical member" and a "mirror member" according to the present disclosure.

In the light source device 110B, some red collimator lenses 11R among the plurality of red collimator lenses 11R are disposed to be eccentric to the optical axis of the corresponding red light source 10R. Some green collimator lenses 11G among the plurality of green collimator lenses 11G are disposed to be eccentric to the optical axis of the corresponding green light source 10G. Some blue collimator lenses 11B among the plurality of blue collimator lenses 11B are disposed to be eccentric to the optical axis of the corresponding blue light source 10B.

The eccentric direction and the eccentricity of each collimator lens are adjusted to be the direction and the eccentricity that make it possible to combine optical paths of the light beams of an identical color. For example, the eccentric direction of the red collimator lens 11R is the direction of the center position among the plurality of red collimator lenses 11R. That is, in the configuration example in FIG. 6, the eccentricity of the red collimator lens 11R located at the center of three red collimator lenses 11R is zero, and the two red collimator lenses 11R on both sides are each eccentric toward the red collimator lens 11R located in the middle.

The green collimator lenses 11G and the blue collimator lenses 11B are also eccentric in the same manner.

In the light source device 110B, combination of the optical paths of the light beams of different colors is performed by the dichroic mirror 12R, the dichroic mirror 12G, and the total reflection mirror 12B.

The dichroic mirror 12R is disposed on an optical path of red light, transmits the red light, and also reflects blue light and green light in a direction identical to a transmission direction of the red light.

The dichroic mirror 12G is disposed on an optical path of green light, reflects the green light toward the dichroic mirror 12R, and also transmits blue light toward the dichroic mirror 12R.

The total reflection mirror 12B is disposed on an optical path of blue light, and reflects the blue light toward the dichroic mirror 12G.

In this manner, in the light source device 110B, the optical paths of the light beams of an identical color me combined owing to eccentricity of each collimator lens. Moreover, the optical paths of the light beams of different colors are combined by each mirror member.

(1.2.3 Third Configuration Example of Light Source Device)

Figure 8:
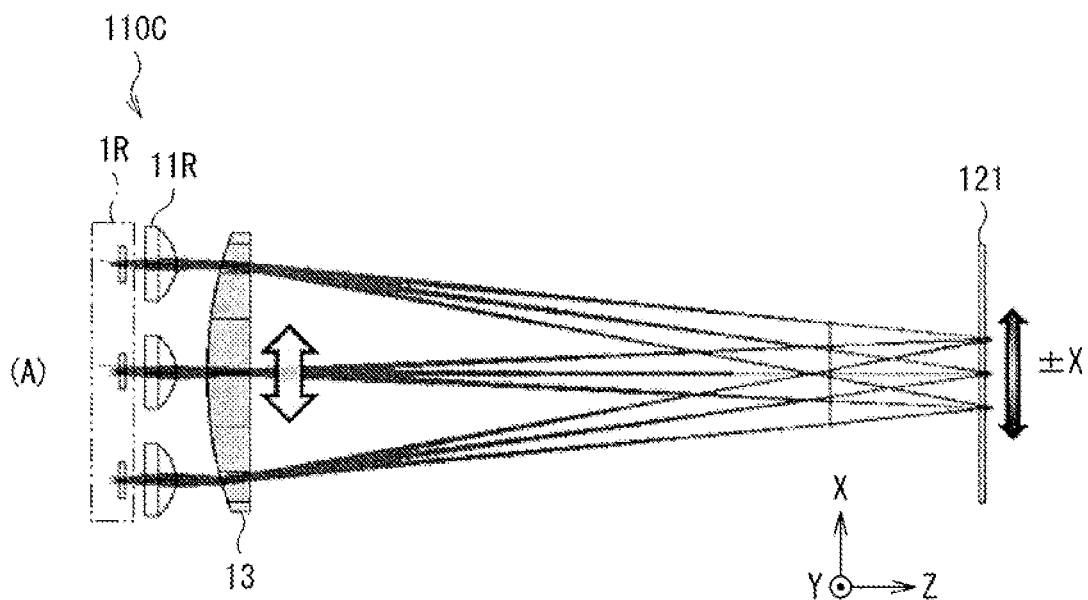
FIG. 8 illustrates a third configuration example of the light source device according to the first embodiment along with how the optical paths of respective colors are combined in top (A in FIG. 8) and side (B in FIG. 8) views.
Figure 8:
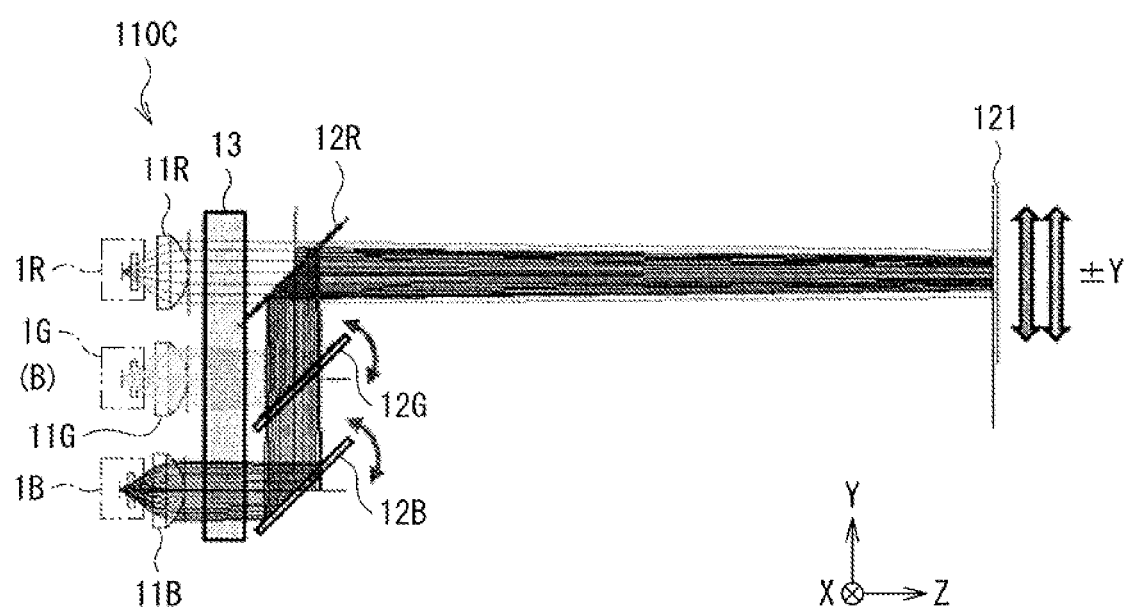

FIG. 8 illustrates a third configuration example of the light source device 110 according to the first embodiment along with how the optical paths of the respective colors are combined. (A) in FIG. 8 is a top view and (B) in FIG. 8 is a side view. It is to be noted that FIG. 8 illustrates a configuration example in a case where each light source of each color includes three light emitting points.

In a light source device 110C illustrated in FIG. 8, unlike the light source device 110A illustrated in FIG. 4 and the light source device 110B illustrated in FIG. 6, all of the plurality of red collimator lenses 11R, the plurality of green collimator lenses 11G, and the plurality of blue collimator lenses 11B are not eccentric.

The light source device 110C illustrated FIG. 8 further includes the dichroic mirror 12R, the dichroic mirror 12G, and the total reflection mirror 12B in addition to the configuration of the light source device 110. The light source device 110C illustrated in FIG. 8 further includes a cylindrical lens 13.

In the light source device 110C illustrated in FIG. 8, the cylindrical lens 13 corresponds to a specific example of the "first optical-path combining optical member" and the "lens member" according to the present disclosure. Furthermore, each of the dichroic mirror 12R, the dichroic mirror 12G, and the total reflection mirror 12B corresponds to a specific example of the "second optical-path combining optical member" and the "mirror member" according to the present disclosure.

The cylindrical lens 13 is disposed on an optical path between each collimator lens and each mirror member. The cylindrical lens 13 is disposed in common to the light sources of the respective colors. The cylindrical lens 13 is disposed to combine optical paths of light beams of an identical color. The cylindrical lens 13 is disposed to have power in an arrangement direction (X direction) of a plurality of light sources of an identical color (see (A) in FIG. 8). Moreover, the cylindrical lens 13 is disposed not to have power in an arrangement direction (Y direction) of the light sources of a different color (see (B) in FIG. 8).

In the light source device 110C, combination of the optical paths of the light beams of different colors is performed by the dichroic mirror 12R, the dichroic mirror 12G, and the total reflection mirror 12B in a manner similar to the light source device 110B (FIG. 7).

It is to be noted that the light of each color is emitted from the light source device 110C toward a fly-eye lens array 121 of the illumination optical system 120 (FIG. 1). An incident position of the light of each color on the fly-eye lens array 121 is adjustable in the X direction by a position of the cylindrical lens 13 (see (A) in FIG. 8). Moreover, the incident position is adjustable in the Y direction by arrangement angles of the dichroic mirror 12G and the total reflection mirror 12B (see (B) in FIG. 8).

In this manner, in the light source device 110C, the optical paths of the light beams of an identical color are combined by the cylindrical lens 13. Moreover, the optical paths of the light beams of different colors are combined by each mirror member.

[1.3 Relation Between Eccentricity and Incident Angle on Illumination Optical System]

Taking an example of the light source device 110B illustrated in FIG. 6, a relation between the eccentricity of the light source device 110B and the incident angle on the fly-eye lens array 121 of the illumination optical system 120 is described.

(A Case Where Each Light Source has One Light Emitting Point)

Figure 9:
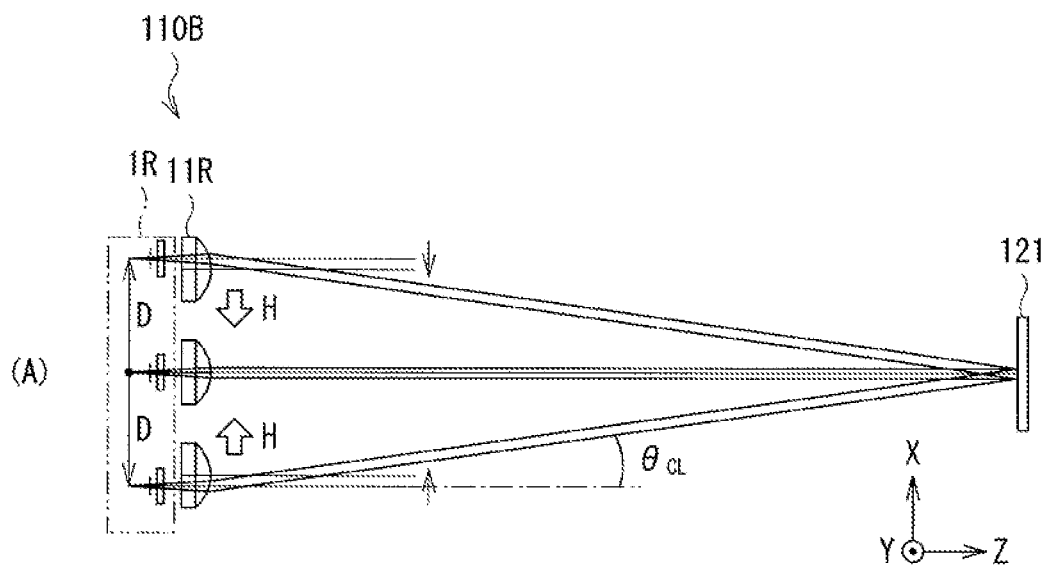
FIG. 9 schematically illustrates optical paths of respective colors in top (A in FIG. 9) and side (B in FIG. 9) views in FIG. 10 is an explanatory drawing schematically illustrating an angle of a light ray entering a fly-eye lens.
Figure 9:
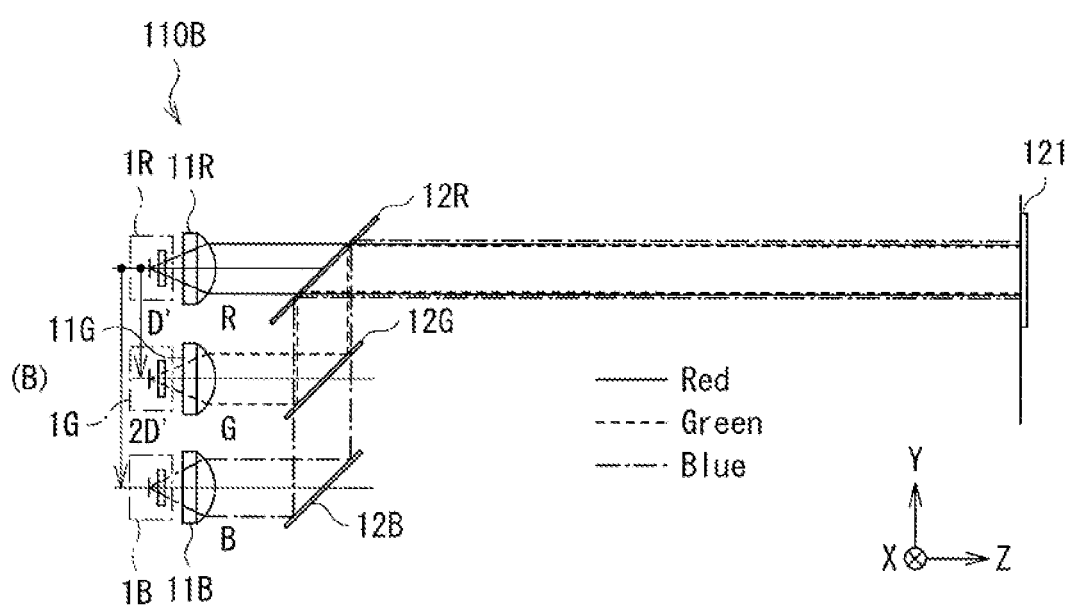
Figure 10:
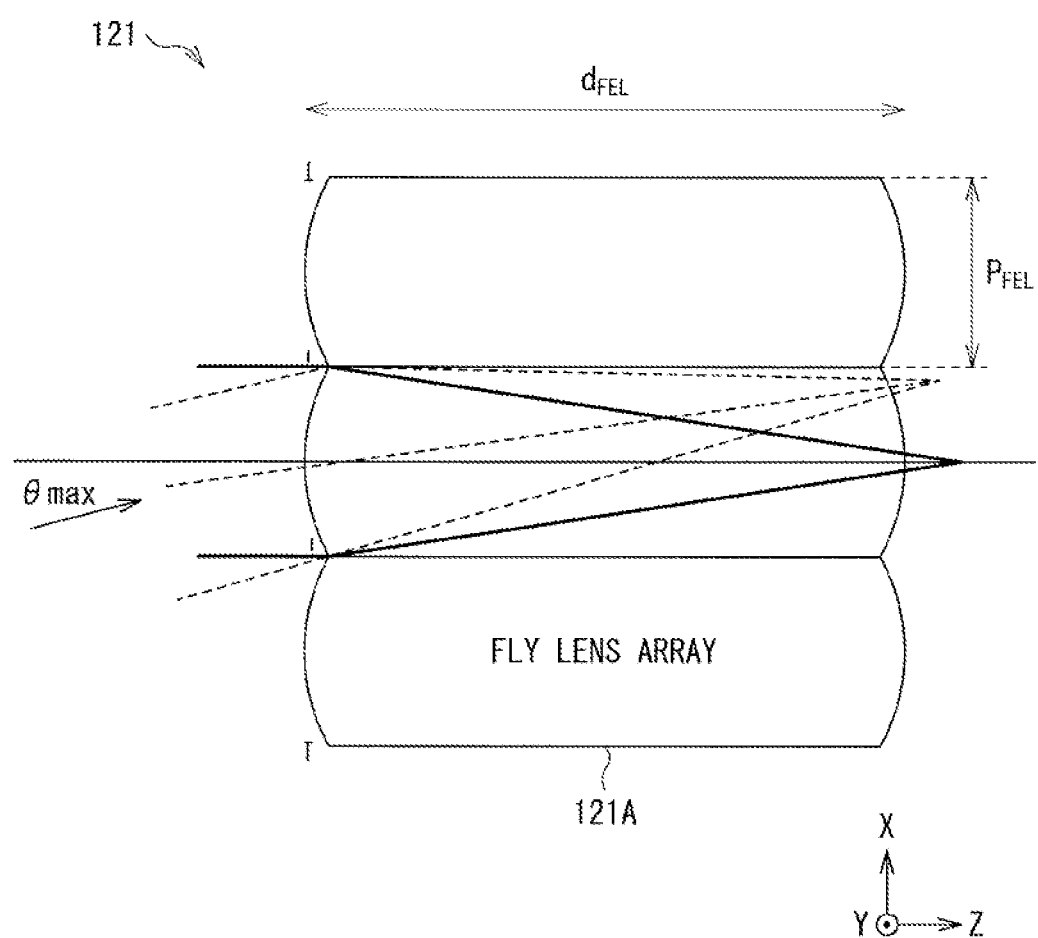

FIG. 9 schematically illustrates optical paths of respective colors in a case where each light source has one light emitting point in each of the red light source section 1R, the green light source section 1G, and the blue light source section 1B in the light source device 110B illustrated in FIG. 6. (A) in FIG. 9 is a top view and (B) in FIG. 9 is a side view. FIG. 10 schematically illustrates an angle of a light ray entering one fly-eye lens 121A in the fly-eye lens array 121.

As described above, in the light source device 110B, the optical paths of the light beams of an identical color are combined owing to eccentricity of each collimator lens. Moreover, the optical paths of the light beams of different colors are combined by each mirror member. In the light source device 110B, the optical paths of the light beams emitted from the respective light source sections are combined, allowing the light beams emitted from the respective light source sections to enter the fly-eye lens 121A at an incident angle within a range.

Here, conditions for effectively transferring the light from the light source device 110B to an optical system in a stage later than the fly-eye lens array 121 of the illumination optical system 120 are described.

The fly-eye lens array 121 is an assembly of a plurality of minute lenses (fly-eye lenses 121A). As illustrated in FIG. 10, each of the plurality of fly-eye lenses 121A has a biconvex structure. Each of the plurality of fly-eye lenses 121A is designed to make its focal length to be substantially equal to an emission position. This makes it possible for the light having passed through a focal point on an incident side of the fly-eye lens 121A and entered obliquely to be outputted in parallel on an emission side of the fly-eye lens 121A. That is, for a given fly-eye lens 121A, unless light enters an adjacent fly-eye lens 121A, the optical axis of an incident light flux does not cause tilt of the optical axis, making it possible to effectively transfer the light to the optical system in the stage later than the fly-eye lens array 121. On the other hand, in a case where the light enters the adjacent fly-eye lens 121A, the optical axis is refracted largely, making it difficult to effectively transfer the light to the optical system in the later stage. In the following, an incident angle at the very limit before entering the adjacent fly-eye lens 121A is referred to as an allowable angle θ max.

The allowable angle θ max is defined as follows.

$$\theta\ max = arc\ tan(P_{FEL}/2d_{FEL})$$

$d_{FEL}$: Thickness of one fly-eye lens 121A on the optical axis $P_{FE}$: Pitch of one fly-eye lens 121A Next, an angle $\theta_{CL}$ after decentering the light ray from each light source by each collimator lens is expressed by the following expression.

$$\theta_{CL} = arc\ tan(H/f_{CL})$$

$f_{CL}$: Focal length of the collimator lens
H: Eccentricity of the collimator lens From these, it is desirable that the conditions for effectively transferring the light from the light source device 110B to the optical system in the stage later than the fly-eye lens army 121 should satisfy $$\theta\ max > \theta_{CL}.$$

(A Case where Each Light Source has a Plurality of Light Emitting Points)

Figure 11:
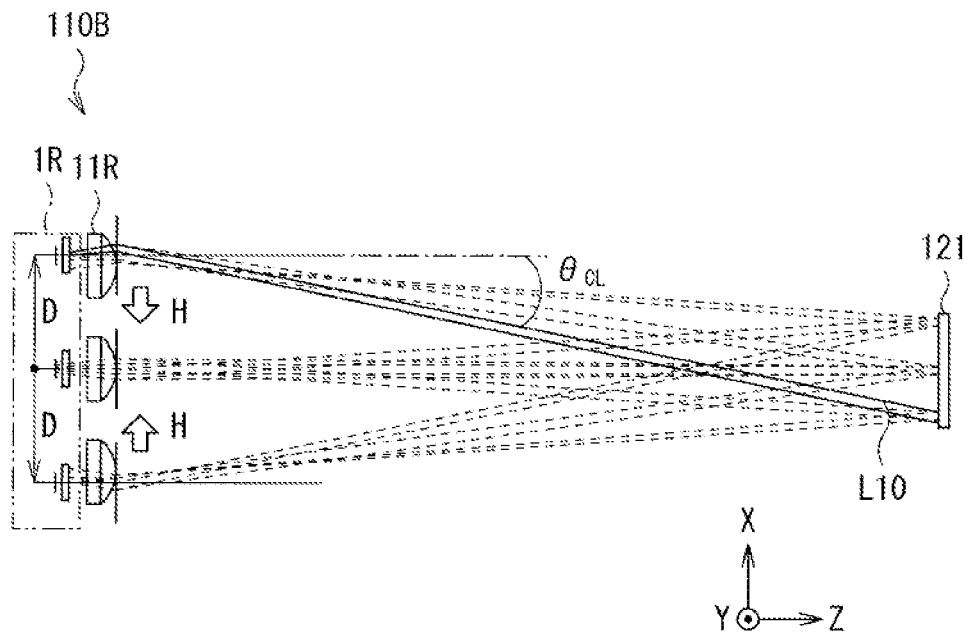
FIG. 11 is a top view schematically illustrating optical paths of light beams of one color in a case where there is a plurality of light emitting points with respect to each light source in the light source device illustrated in FIG. 6.
Figure 12:
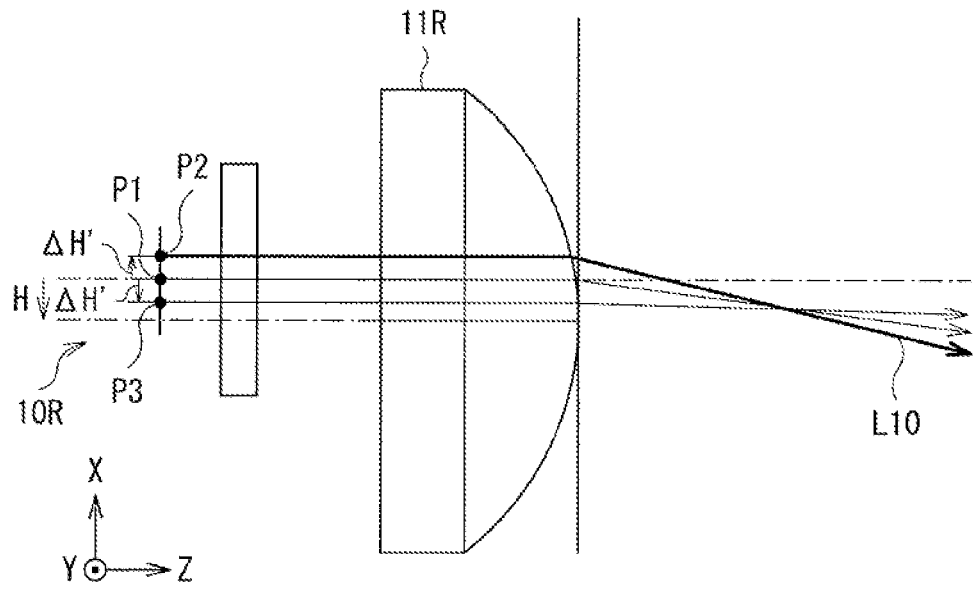
FIG. 12 is a partial enlarged view of an enlarged vicinity of the light emitting point of one light source in FIG. 11.
Figure 13:
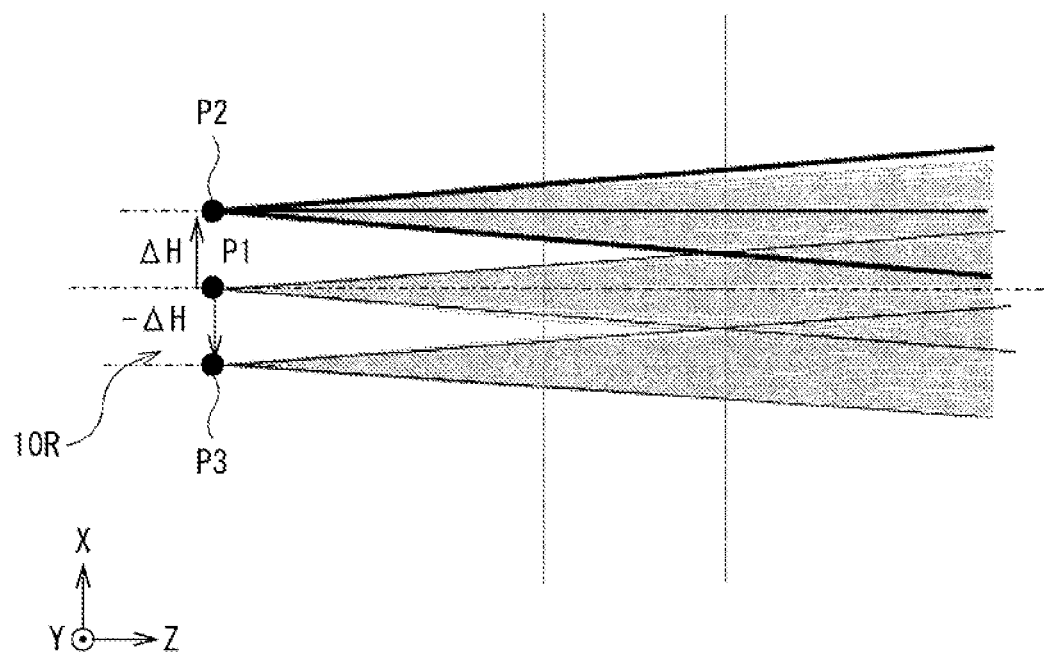
FIG. 13 is an explanatory drawing schematically illustrating a state of light rays emitted from the respective light emitting points of the one light source in FIG. 11.

FIG. 11 schematically illustrates optical paths of light beams of one color in a case where each light source has a plurality of light emitting points (here, three) in the light source device 110B illustrated in FIG. 6. FIG. 6 illustrates a configuration (light source section 1R and red collimator lens 11R) and optical paths about red color as a representative. Further, FIG. 12 illustrates a partially enlarged vicinity of the light emitting point of one light source in FIG. 11. FIG. 13 schematically illustrates a state of light rays emitted from respective light emitting points of one light source in FIG. 11. In the following, although description is given taking an example of the red light, the same applies to light of other colors.

In a case where each red light source 10R has a plurality of light emitting points and the red collimator lens 11R is made eccentric, the light ray outputted from the red collimator lens 11R may have a still larger emission angle than in the above-described case where there is only one light emitting point. Accordingly, conditions for an angle $\theta_{CL3}$ of the light ray from each red light source 10R after decentering in a case where each red light source 10R has a plurality of light emitting points and the allowable angle θ max of the light entering the fly-eye lens 121A are described below.

The angle of entering the fly-eye lens 121A is larger with a light ray L10 illustrated in FIG. 11, for example. As illustrated in FIG. 12 and FIG. 13 in an enlargement, in a case where the red collimator lens 11R is made eccentric to the optical axis of the red light source 10R by H, the eccentricity of the light ray L10 from a light emitting point P2 located above a light emitting point P1 at the center is derived by adding an eccentricity ΔH to the eccentricity H, which is H+ΔH. Moreover, the eccentricity of the light ray from a light emitting point P3 below the light emitting point P1 at the center is derived by subtracting the eccentricity ΔH from the eccentricity ΔH, which is H−ΔH.

The allowable angle θ max of the light entering the fly-eye lens 121A does not change because it is determined by a parameter of the fly-eye lens 121A. It is possible to express an angle of the light ray entering the fly-eye lens 121A as described below.

The angle of the light ray entering the fly-eye lens 121A becomes the largest with the light ray L10 from the light emitting point P2. It is possible to express the angle $\theta_{CL3}$ of the light ray L10 from the light emitting point P2 after decentering by the following expression.

$$\theta_{CL3} = arc\ tan((H+\Delta H)/f_{CL})$$

$f_{CL}$: Focal length of the red collimator lens 11R
H: Eccentricity of the red collimator lens 11R
ΔH: Amount of shift of the light emitting point from the optical axis From these, it is desirable that the conditions for effectively transferring the red light from the light source device 110B to the optical system in the stage later than the fly-eye lens array 121 should satisfy $$\theta\ max > \theta_{CL3}.$$

The same conditions are applicable to light beams of other colors.

As described above, it is desirable that the optical system should be designed to satisfy the allowable angle θ max of the light entering the fly-eye lens 121A depending on difference in the configuration of the light source.

[1.4 Effects]

As described above, according to the present embodiment, because the light source section having a plurality of light sources is mounted on a single light source substrate 3 and the optical paths of light beams emitted from respective light source sections are combined, it is possible to be compact in size and increase luminance.

According to the present embodiment, it is possible to reduce an interval between the light sources of each color. Moreover, it is possible to effectively exhaust heat of each light source from the back surface of the light source substrate 3. In this case, it is possible to reduce the size of a heatsink for heat exhaust, which is advantageous for miniaturization. According to the present embodiment, it is possible to be compact in size, and reduce the number of parts, and to increase luminance. This makes it possible to improve heat exhaust efficiency and achieve an effective projector. Moreover, because the optical paths are combined using the lens member, it is possible to reduce the mirror members used for combining the optical paths.

It is to be noted that the effects described in the present specification are merely exemplary, and there may be other effects. The same applies to the effects of other embodiments described below.

2. Second Embodiment

Next, a light source device, an illumination apparatus, and a projector according to a second embodiment of the present disclosure are described. It is to be noted that, in the following, components substantially similar to those of the light source device, the illumination apparatus, and the projector according to the above-described first embodiment are denoted with the same reference numerals, and descriptions thereof are omitted as appropriate.

Although all of the red light source section 1R, the green light source section 1G, and the blue light source section 1B are mounted on a single light source substrate 3 in the light source device according to the above-described first embodiment, as described below, the light source substrate 3 may be divided into a plurality of pieces.

Here, advantages of dividing the light source substrate 3 into a plurality of pieces are described. Heat resistant temperature varies depending on a property (physical property) of a light source material. In a case of defining a product life of a light source, an upper temperature limit of the light source may vary depending on the color such as, for example, the upper temperature limit of a red laser light source is 55° C. and the upper temperature limit of blue and green laser light sources is 60° C. Therefore, it is sometimes more advantageous in terms of temperature margin to divide the substrate into a plurality of pieces than using a single light source substrate 3. Moreover, in general, because temperature characteristics of a red light source are inferior to those of a blue light source and a green light source, an optical output decreases with respect to electric current as the temperature increases. Accordingly, it is desirable to configure the red light source not to be affected by heat generated by the blue light source and the green light source. Moreover, the green light source easily generates heat because of its lower luminous efficiency (electricity>light). Furthermore, it is more desirable to separate the light source substrate 3 for each color in some cases.

[2.1 First Configuration Example of Light Source Device]

Figure 14:
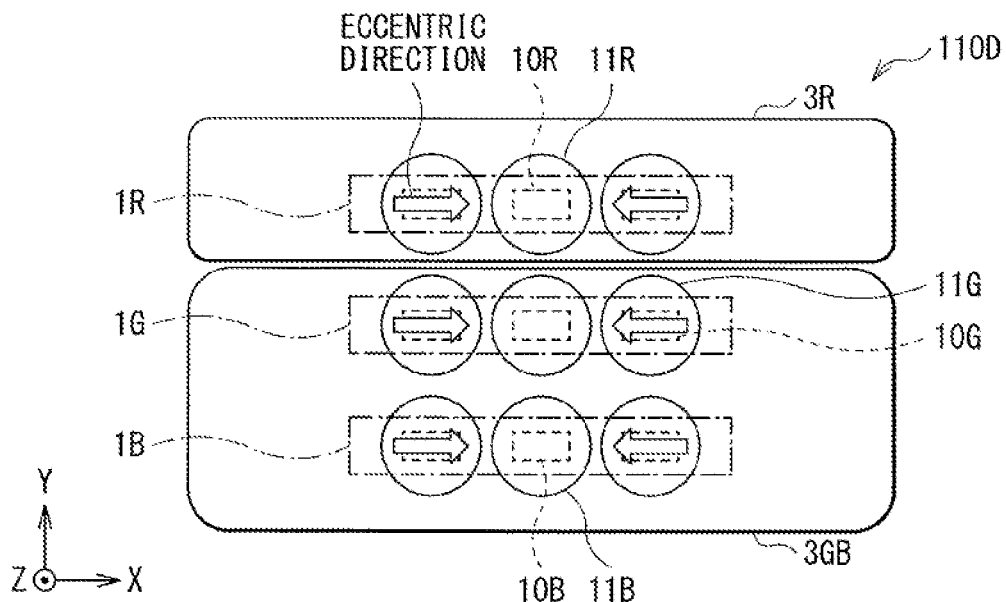
FIG. 14 is a plan view of a first configuration example of a light source device according to a second embodiment.
Figure 15:
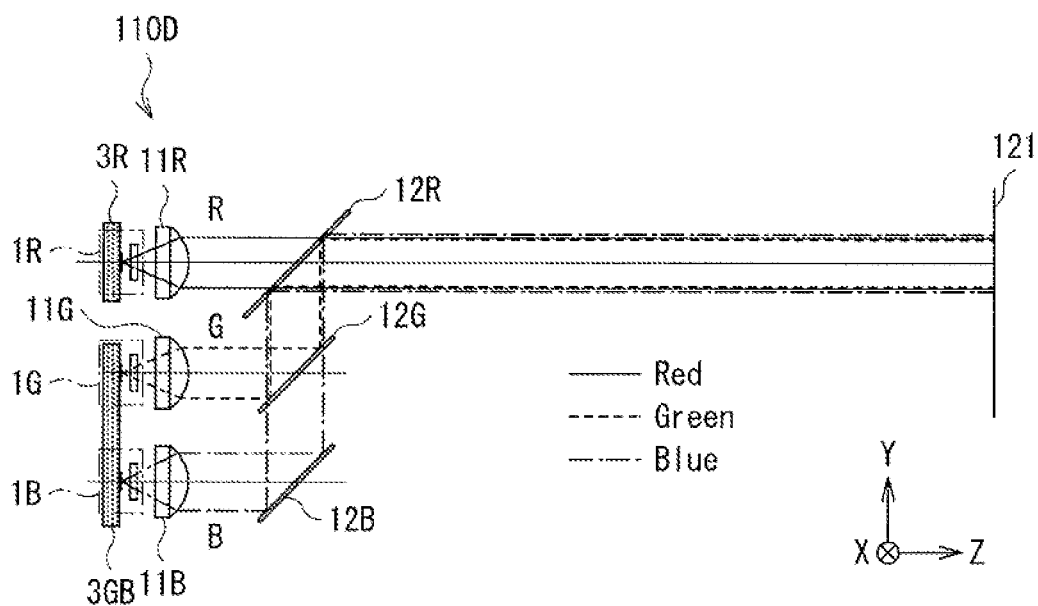
FIG. 15 is a side view of a configuration of the light source device illustrated in FIG. 14 along with how optical paths of respective colors are combined.

FIG. 14 illustrates a first configuration example of the light source device according to the second embodiment. FIG. 15 illustrates a configuration of a light source device 110D illustrated in FIG. 14 along with how the optical paths of each color are combined.

The light source device 110D illustrated in FIG. 14 and FIG. 15 includes two light source substrates 3R and 3GB in addition to the light source device 110B illustrated in FIG. 6 and FIG. 7. The red light source section 1R is mounted on the light source substrate 3R. The green light source section 1G and the blue light source section 1B are mounted on the light source substrate 3GB.

[2.2 Second Configuration Example of Light Source Device]

Figure 16:
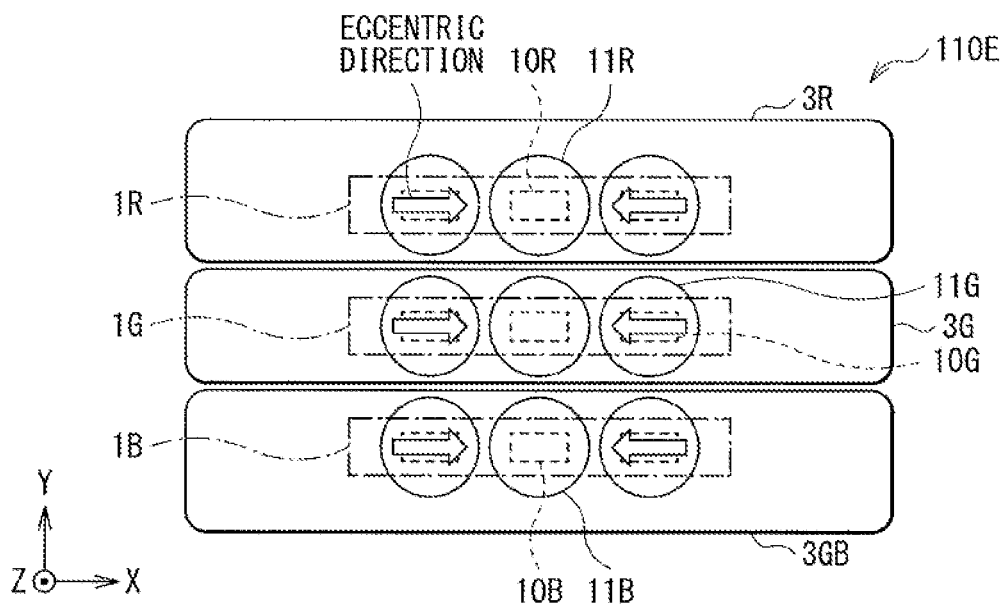
FIG. 16 is a plan view of a second configuration example of the light source device according to the second embodiment.
Figure 17:
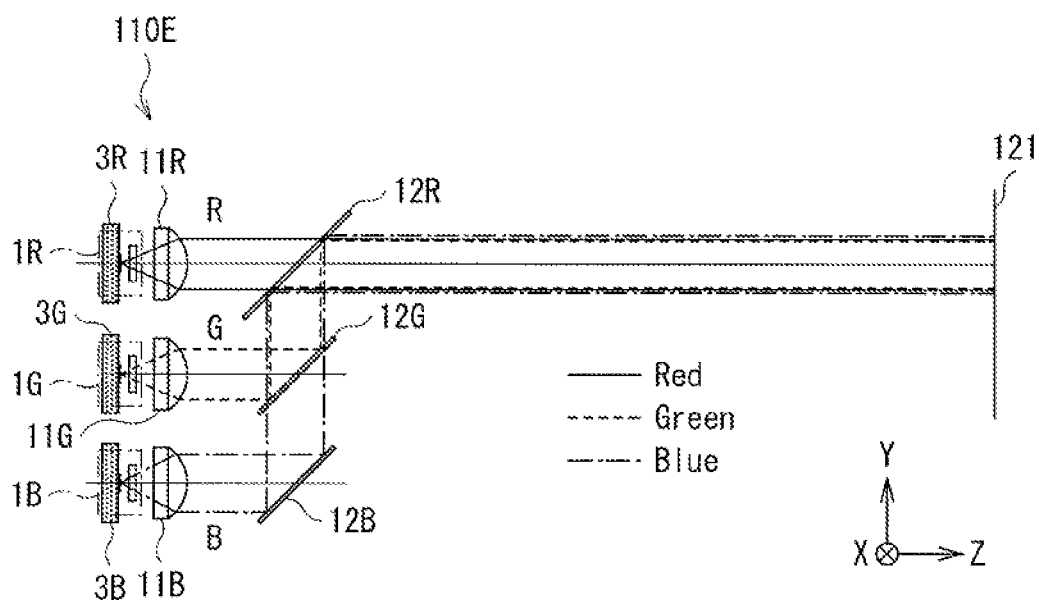
FIG. 17 is a side view of a configuration of the light source device illustrated in FIG. 16 along with how optical paths of respective colors are combined.

FIG. 16 illustrates the first configuration example of the light source device according to the second embodiment. FIG. 17 illustrates a configuration of a light source device 110E illustrated in FIG. 16 along with how the optical paths of each color are combined.

The light source device 110E illustrated in FIG. 16 and FIG. 17 includes three light source substrates 3R, 3G, and 3B in addition to the light source device 110B illustrated in FIG. 6 and FIG. 7. The red light source section 1R is mounted on the light source substrate 3R. The green light source section 1G is mounted on the light source substrate 3G. The blue light source section 1B is mounted on the light source substrate 3B.

In this manner, mounting the light sources of an identical color on an identical substrate and the light sources with different wavelengths on different substrates increases a degree of freedom of arrangement of the light sources and facilitates adjustment of arrangement with respect to each color.

Other configurations, operations, and effects may be substantially similar to those of the light source device, the illumination apparatus, and the projector according to the above-described first embodiment.

3. Third Embodiment

Next, a light source device, an illumination apparatus, and a projector according to a third embodiment of the present disclosure are described. It is to be noted that, in the following, components substantially similar to those of the light source device, the illumination apparatus, and the projector according to the above-described tint or second embodiment are denoted with the same reference numerals, and descriptions thereof are omitted as appropriate.

Figure 18:
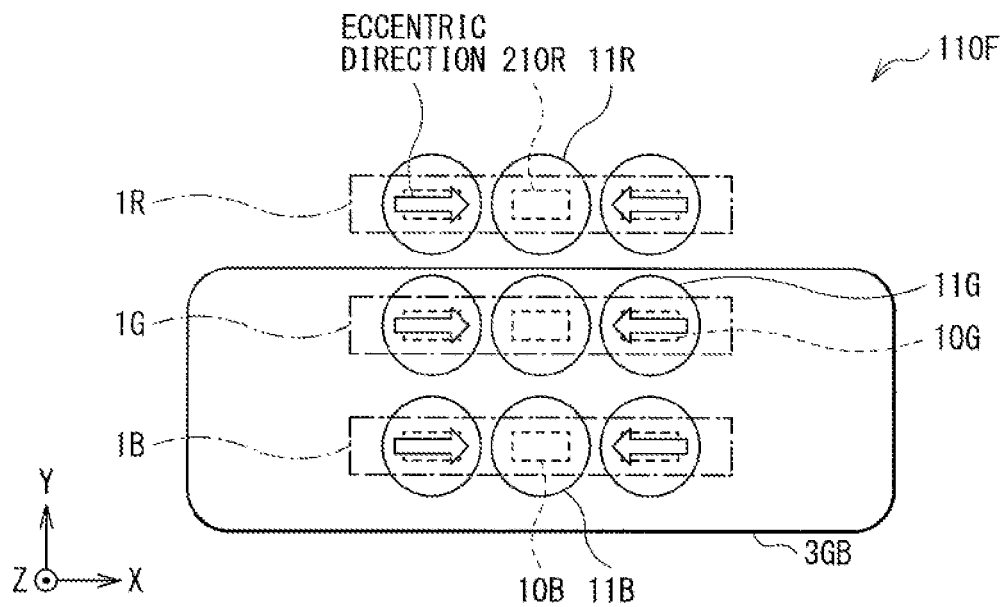
FIG. 18 is a plan view of one configuration example of a light source device according to a third embodiment.
Figure 19:
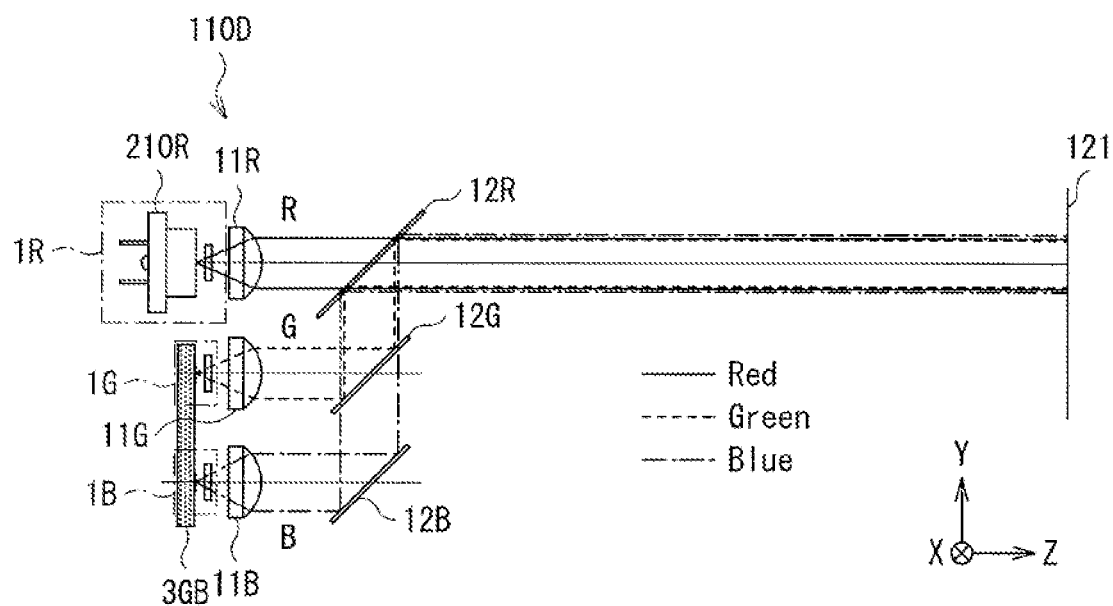
FIG. 19 is a side view of a configuration of the light source device illustrated in FIG. 18 along with how optical paths of respective colors are combined.

FIG. 18 illustrates one configuration example of a light source device according to the third embodiment. FIG. 19 illustrates a configuration of a light source device 110F illustrated in FIG. 18 along with how the optical paths of each color are combined.

The light source device according to the above-described first and second embodiments employs a substrate mounting method by which the red light source section 1R, the green light source section 1G, and the blue light source section 1B are mounted on one or more light source substrates. In contrast, some of the light source sections may employ a CAN laser disposed separately from the light source substrate, instead of employing the substrate mounting method.

In the light source device 110F illustrated in FIG. 14 and FIG. 15, the green light source section 1G and the blue light source section 1B are mounted on a single light source substrate 3GB as compared to the light source device 110B illustrated in FIG. 6 and FIG. 7. On the other hand, the red light source section 1R does not employ the substrate mounting method but includes the CAN laser that emits red light in place of the red light source 10R.

It is to be noted that the light source of a color other than red may be replaced by the CAN laser. In a case where it is difficult to mount a light source of a specific color by the substrate mounting method, only the light source of the specific color may include the existing CAN laser.

Other configurations, operations, and effects may be substantially similar to those of the light source device, the illumination apparatus, and the projector according to the above-described first embodiment.

4. Other Embodiments

A technology according to the present disclosure is not limited to the above-described description of each embodiment, and may be implemented in a variety of ways.

For example, it is also possible for the present technology to take the following configurations. According to the present technology with the following configuration, because the light source section having a plurality of light sources is mounted on a single light source substrate and the optical paths of the light beams emitted from respective light source sections are combined, it is possible to be compact in size and increase luminance.

(1)

A light source device, including:

a plurality of light source sections, each light source section having at least one light source and the light source sections emitting light beams of mutually different colors;

at least one light source substrate mounted with at least one light source section among the plurality of light source sections; and an optical-path combining optical system that combines optical paths of light beams emitted from the respective light source sections, wherein the at least one light source section mounted on the light source substrate includes a plurality of the light sources that emits light beams of an identical color.

(2)

The light source device according to (1), in which the optical-path combining optical system includes at least one first optical-path combining optical member that combines a plurality of optical paths of light beams of an identical color emitted from the plurality of light sources that emits light beams of an identical color, the plurality of light sources being included in the light source section mounted on the light source substrate.

(3)

The light source device according to (2), including:

a plurality of lens members individually disposed respectively with respect to the plurality of light sources that emits light beams of an identical color, as at least one first optical-path combining optical member, in which at least one of the plurality of lens members is disposed to be eccentric to an optical axis of the light source.

(4)

The light source device according to (2), including:

a cylindrical lens disposed in common to the plurality of light sources that emits light beams of an identical color, as the first optical-path combining optical member.

(5)

The light source device according to any one of (1) to (4), in which the optical-path combining optical system includes at least one second optical-path combining optical member that combines optical paths of light beams of a plurality of colors emitted from the plurality of light source sections.

(6)

The light source device according to (5), in which the second optical-path combining optical member is a mirror member.

(7)

The light source device according to any one of (1) to (6), in which the plurality of light source sections is all mounted on the light source substrate.

(8)

The light source device according to any one of (1) to (6), including:

a plurality of the light source substrates, in which the plurality of light source sections is respectively mounted on the light source substrates different from one another.

(9)

The light source device according to any one of (1) to (6), in which, among the plurality of light source sections, some of the light source sections are CAN lasers disposed separately from the light source substrate.

(10)

An illumination apparatus, including:

a light source device; and an illumination optical system that generates illumination light on the basis of light from the light source device, in which the light source device includes a plurality of light source sections, each light source section having at least one light source and the light source sections emitting light beams of mutually different colors, at least one light source substrate mounted with at least one light source section among the plurality of light source sections, and an optical-path combining optical system that combines optical paths of light beams emitted from the respective light source sections, and the at least one light source section mounted on the light source substrate includes a plurality of the light sources drat emits light beams of an identical color.

(11)

The illumination apparatus according to (10), in which the illumination optical system includes a fly-eye lens, and the optical-path combining optical system combines the optical paths of the light beams emitted from the respective light source sections allowing the light beams emitted from the respective light source sections to enter the fly-eye lens at an incident angle within a predetermined range.

(12)

A projector, including:

an illumination apparatus;

a light modulation element that modulates illumination light from the illumination apparatus and generates a projection image; and a projection optical system that projects the projection image generated by the light modulation element on a projection surface, in which the illumination apparatus includes a plurality of light source sections, each light source section having at least one light source and the light source sections emitting light beams of mutually different colors, at least one light source substrate mounted with at least one light source section among the plurality of light source sections, and an optical-path combining optical system that combines optical paths of light beams emitted from the respective light source sections, and the at least one light source section mounted on the light source substrate includes a plurality of the light sources that emits light beams of an identical color.

This application claims the benefit of Japanese Priority Patent Application JP 2017-233186 filed with the Japan Patent Office on Dec. 5, 2017, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A light source device, comprising:

a plurality of light source sections, each light source section having at least one light source and the light source sections emitting light beams of mutually different colors;

at least one light source substrate mounted with at least one light source section among the plurality of light source sections;

an optical-path combining optical system that combines optical paths of light beams emitted from the respective light source sections, wherein the at least one light source section mounted on the light source substrate includes a plurality of the light sources that emits light beams of an identical color, and wherein the optical-path combining optical system includes at least one first optical-path combining optical member that combines a plurality of optical paths of light beams of an identical color emitted from the plurality of light sources that emits light beams of an identical color, the plurality of light sources being included in the light source section mounted on the light source substrate; and a plurality of lens members individually disposed respectively with respect to the plurality of light sources that emits light beams of an identical color, as at least one first optical-path combining optical member, wherein at least one of the plurality of lens members is disposed to be eccentric to an optical axis of the light source.

2. The light source device according to claim 1, wherein the optical-path combining optical system includes at least one second optical-path combining optical member that combines optical paths of light beams of a plurality of colors emitted from the plurality of light source sections.

3. The light source device according to claim 2, wherein the second optical-path combining optical member is a mirror member.

4. The light source device according to claim 1, wherein the plurality of light source sections is all mounted on the light source substrate.

5. The light source device according to claim 1, comprising:

a plurality of the light source substrates, wherein
the plurality of light source sections is respectively mounted on the light source substrates different from one another.

6. The light source device according to claim 1, wherein, among the plurality of light source sections, some of the light source sections are CAN lasers disposed separately from the light source substrate.

7. An illumination apparatus, comprising:

a light source device; and
an illumination optical system that generates illumination light on a basis of light from the light source device, wherein
the light source device includes:
a plurality of light source sections, each light source section having at least one light source and the light source sections emitting light beams of mutually different colors;
at least one light source substrate mounted with at least one light source section among the plurality of light source sections;
an optical-path combining optical system that combines optical paths of light beams emitted from the respective light source sections,
wherein the at least one light source section mounted on the light source substrate includes a plurality of the light sources that emits light beams of an identical color, and
wherein the optical-path combining optical system includes at least one first optical-path combining optical member that combines a plurality of optical paths of light beams of an identical color emitted from the plurality of light sources that emits light beams of an identical color, the plurality of light sources being included in the light source section mounted on the light source substrate; and
a plurality of lens members individually disposed respectively with respect to the plurality of light sources that emits light beams of an identical color, as at least one first optical-path combining optical member, wherein at least one of the plurality of lens members is disposed to be eccentric to an optical axis of the light source.

8. The illumination apparatus according to claim 7, wherein
the illumination optical system includes a fly-eye lens, and
the optical-path combining optical system combines the optical paths of the light beams emitted from the respective light source sections allowing the light beams emitted from the respective light source sections to enter the fly-eye lens at an incident angle within a predetermined range.

9. The illumination apparatus according to claim 7, wherein the optical-path combining optical system includes at least one second optical-path combining optical member that combines optical paths of light beams of a plurality of colors emitted from the plurality of light source sections.

10. The illumination apparatus according to claim 9, wherein the second optical-path combining optical member is a mirror member.

11. The illumination apparatus according to claim 7, wherein the plurality of light source sections is all mounted on the light source substrate.

12. The illumination apparatus according to claim 7, comprising:

a plurality of the light source substrates, wherein
the plurality of light source sections is respectively mounted on the light source substrates different from one another.

13. The illumination apparatus according to claim 7, wherein, among the plurality of light source sections, some of the light source sections are CAN lasers disposed separately from the light source substrate.

14. A projector, comprising:

an illumination apparatus;
a light modulation element that modulates illumination light from the illumination apparatus and generates a projection image; and
a projection optical system that projects the projection image generated by the light modulation element on a projection surface, wherein
the illumination apparatus includes:
a plurality of light source sections, each light source section having at least one light source and the light source sections emitting light beams of mutually different colors;
at least one light source substrate mounted with at least one light source section among the plurality of light source sections;
an optical-path combining optical system that combines optical paths of light beams emitted from the respective light source sections,
wherein the at least one light source section mounted on the light source substrate includes a plurality of the light sources that emits light beams of an identical color, and
wherein the optical-path combining optical system includes at least one first optical-path combining optical member that combines a plurality of optical paths of light beams of an identical color emitted from the plurality of light sources that emits light beams of an identical color, the plurality of light sources being included in the light source section mounted on the light source substrate; and
a plurality of lens members individually disposed respectively with respect to the plurality of light sources that emits light beams of an identical color, as at least one first optical-path combining optical member,
wherein at least one of the plurality of lens members is disposed to be eccentric to an optical axis of the light source.

15. The projector according to claim 14, wherein the optical-path combining optical system includes at least one second optical-path combining optical member that combines optical paths of light beams of a plurality of colors emitted from the plurality of light source sections.

16. The projector according to claim 15, wherein the second optical-path combining optical member is a mirror member.

17. The projector according to claim 14, wherein the plurality of light source sections is all mounted on the light source substrate.

18. The projector according to claim 14, comprising:
a plurality of the light source substrates, wherein
the plurality of light source sections is respectively mounted on the light source substrates different from one another.

19. The projector according to claim 14, wherein, among the plurality of light source sections, some of the light source sections are CAN lasers disposed separately from the light source substrate.

* * * * *